(12) United States Patent
Seidler

(10) Patent No.: US 6,870,091 B2
(45) Date of Patent: Mar. 22, 2005

(54) TWO-PIECE ELECTRICAL RF SHIELD AND METHOD OF MANUFACTURING THE SAME

(75) Inventor: Jack Seidler, Flushing, NY (US)

(73) Assignee: Interplex Nas, Inc., Flushing, NY (US)

( * ) Notice: Subject to any disclaimer, the term of this patent is extended or adjusted under 35 U.S.C. 154(b) by 94 days.

(21) Appl. No.: 10/286,373

(22) Filed: Nov. 1, 2002

(65) Prior Publication Data

US 2004/0084198 A1 May 6, 2004

(51) Int. Cl.[7] .................................................. H05K 9/00
(52) U.S. Cl. ........................ 174/35 R; 361/816; 361/818
(58) Field of Search ........................... 174/35 R, 35 GC; 361/800, 816, 818, 796, 799, 801

(56) References Cited

U.S. PATENT DOCUMENTS

| | | | | |
|---|---|---|---|---|
| 5,354,951 A | * | 10/1994 | Lange et al. ............... | 174/35 R |
| 5,495,399 A | * | 2/1996 | Gore et al. ................. | 361/814 |
| 5,513,996 A | * | 5/1996 | Annerino et al. ............ | 439/95 |
| 5,895,884 A | * | 4/1999 | Davidson ................... | 174/35 R |
| 6,274,808 B1 | * | 8/2001 | Cercioglu et al. ..... | 174/35 GC |
| 6,552,261 B2 | * | 4/2003 | Shlahtichman et al. ... | 174/35 R |
| 6,628,524 B1 | * | 9/2003 | Washino et al. ............ | 361/737 |

* cited by examiner

*Primary Examiner*—Dean A. Reichard
*Assistant Examiner*—Carmelo Oliva
(74) *Attorney, Agent, or Firm*—Darby & Darby

(57) ABSTRACT

A two-piece RF interference shield and method of manufacturing the same that is cost efficient and easily adapted for use with existing electrical devices. The RF shield includes a bottom portion mounted to the circuit board and a top portion which fits onto the bottom portion. The RF electrical interference shield can be mounted to circuit boards (e.g., by soldering) to prevent electrical components from causing RF interference. The RF shield of the present invention also allows for easy removal of the top of the RF shield so as to provide access to the interior for rework or repair of the electrical components covered by the shield, without having to unsolder the bottom portion of the shield. The two-piece shield for shielding an electrical component comprises a top portion and bottom portion that are fitted together so as to enclose the electrical components to be shielded. The top and bottom portions snap together, e.g., by way of barbs located on one of the portions that fit into corresponding holes or slots located on the other portion.

17 Claims, 7 Drawing Sheets

23

Force

23

FIG. 10
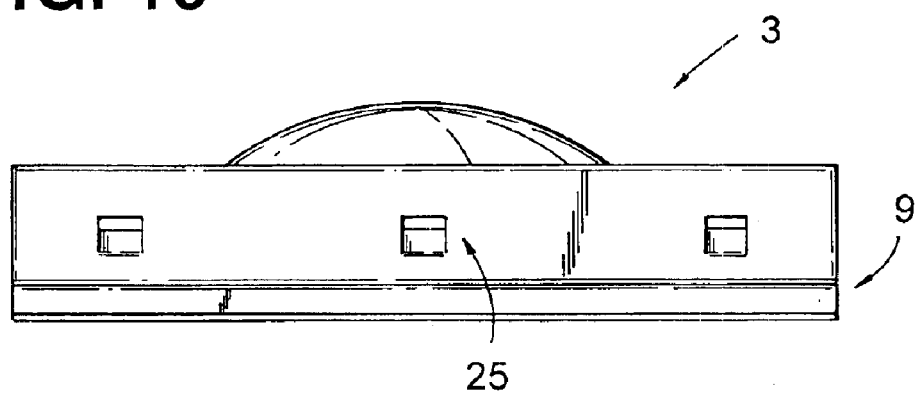
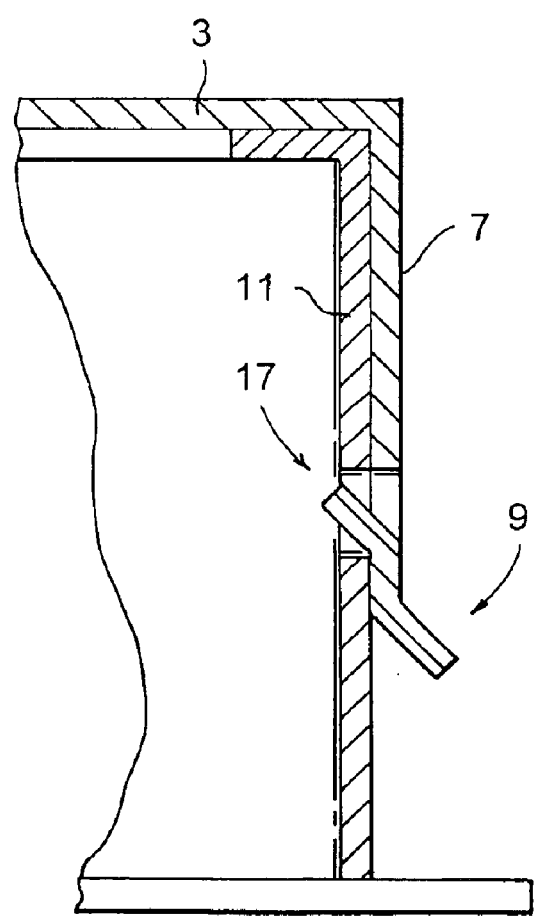
FIG. 11

TWO-PIECE ELECTRICAL RF SHIELD AND METHOD OF MANUFACTURING THE SAME

FIELD OF THE INVENTION

The present invention generally relates to the field of electronics, and more specifically to a Radio Frequency (RF) interference shield for electrical devices.

BACKGROUND OF THE INVENTION

Over the past number of years, the technological advancements in the area of electronic devices has experienced vast growth. For example, while cellular phones are becoming smaller and lighter, simultaneously their features and capabilities are expanding. This has caused an increase in the complexity and operation of the electrical components found in such devices and a decrease in the amount of space available for such components. In such electrical devices, many electronic components radiate electromagnetic radiation which may cause interference with other electrical devices. This RF interference may detrimentally affect the performance and operation of other electrical devices. As a result, RF shields have been used to prevent such components from causing such interference.

The most common RF shields are comprised of a single piece of metal folded into a box and contoured to fit over a PC board. These shields are then soldered onto the circuit board. Over time, the circuit board may require repair or reworking, however, it is extremely time consuming and difficult to unsolder and remove the RF shield originally in place. While there are existing two-piece designs, most are expensive and difficult to disassemble. For example, U.S. Pat. No. 6,178,097 to Hauk discloses an RF shield having a removable cover. Removal of the cover involves severing, with a tool, a frangible connection created by score lines along the outer edges of the top cover and placing the top cover back on the shield requires either re-soldering or latching the top cover back to the RF shield.

Thus, there exists a continuing need for an RF shield that will prevent electrical components of an electrical device from causing RF interference, yet will also allow fast and easy access to the electrical components covered by the RF shield.

SUMMARY OF THE INVENTION

The present invention is for a two-piece RF interference shield and method of manufacturing the same that is cost efficient and easily adapted for use with existing electrical devices. The RF shield includes a bottom portion mounted to the circuit board and a top portion which fits onto the bottom portion. The RF electrical interference shield can be mounted to circuit boards (e.g., by soldering) to prevent electrical components from causing RF interference. The RF shield of the present invention also allows for easy removal of the top of the RF shield so as to provide access to the interior for rework or repair of the electrical components covered by the shield, without having to unsolder the bottom portion of the shield.

In accordance with one embodiment of the invention, the two-piece shield for shielding an electrical component comprises a top portion and bottom portion that are fitted together so as to enclose the electrical components to be shielded. The top and bottom portions snap together, e.g., by way of barbs located on one of the portions that fit into corresponding holes or slots located on the other portion.

The bottom portion includes a plurality of sidewalls that form an enclosure about the electrical components sought to be protected, wherein two of the bottom portion sidewalls that oppose each other are fitted with holes or slots. The holes or slots of the bottom portion receive the barbs of the top portion. The number and location of the holes or slots on the two bottom portion sidewalls correspond to the number and location of the barbs on the top portion. The bottom portion is mounted to the circuit board sought to be shielded using solder. The sidewalls of the top portion are parallel to and slightly outward of the sidewalls of the bottom portion, and do not extend all the way down to the circuit board. Only the bottom portion sits in the solder paste and is soldered to the board containing the electrical components. The sidewalls of the bottom portion form an enclosure around the circuit board and electrical components sought to be shielded. Since the top of the bottom portion is substantially open, when the top portion is removed, the bottom portion can be entered so as to provide access to the electrical components.

The removable top portion forms the top side of the two-piece RF shield and completes the protective enclosure. The top portion includes a top face having a raised portion, as well as four downwardly extending sidewalls. Alternatively, the top portion may include two opposing downwardly extending sidewalls. The raised portion of the top portion allows an extraction tool to be utilized so that the top portion can be easily disengaged from its connection to the bottom portion. Two of the top portion sidewalls contain the barbs that protrude inwardly toward the bottom portion. The barbs along the two sidewalls of the top portion fit or snap into the corresponding holes or slots of the bottom portion. The sidewalls of the top portion extend downwards, perpendicularly, from the top face and have angled extensions at their bottom edges. The angled extensions of the sidewalls cooperate with an extraction tool to remove the top portion, thereby allowing access to the circuit board underneath. Specifically, the extraction tool pushes down on the raised portion causing the angled extensions to deflect outwardly disengaging the barbs from the slots. Simultaneously, the top cover can be removed by lifting the extraction tool who's side arms are beneath the angled extensions. Similarly, the top portion can be placed back onto the bottom portion by pushing the raised portion of the top portion downward towards the bottom portion and allowing the barbs on the top portion to fit or snap into the holes of the bottom portion.

The RF shield may be manufactured using a stamping process. The top and bottom portions are cut out of a single sheet of metal or other material utilizing a stamping process. The stamping process cuts out all of the necessary holes in the bottom portion and also the barbs of the top portion. Fold indentations are formed on both the top and bottom portion sheets by punch pressing indentations at particular locations. The fold indentations represent the points at which portions of the top and bottom portion sheets are bent so that the RF shield of the present invention is formed. After the sidewalls of the bottom portion are bent upwards to form the sidewalls forming the enclosure, the edges where the sidewalls meet may be spot-soldered to make the bottom portion more rigid.

In accordance with another embodiment of the, invention, the barbs, for snap-fitting the bottom and top portions, may be located on the bottom portion and protrude outwards from the bottom portion towards the top portion. The top portion can be adapted so as to contain holes or slots that correspond in number and location to the barbs of the bottom portion. The extraction tool would serve the same purpose as previously mentioned, however under this alternative design the barbs of the bottom portion remain stationary while the holes of the top portion move outwardly away from the barbs of the bottom portion thus allowing for the desired removal.

In accordance with yet another embodiment of the invention, the bottom portion can be fastened to the electrical board using rivets or clips at the portion of the bottom portion which protrudes slightly below the top portion.

These and other advantages and features of the invention will become readily apparent to those skilled in the art upon a reading of the following description.

BRIEF DESCRIPTION OF THE DRAWINGS

The foregoing and other features of the present invention will be more readily apparent from the following detailed description and drawings of illustrative embodiments of the invention in which:

FIG. 10 is a plan side view of the top portion of an RF shield;

FIG. 11 is an enlarged cross-sectional view of FIG. 7;

DETAILED DESCRIPTION OF THE PREFERRED EMBODIMENTS

Figure 1:
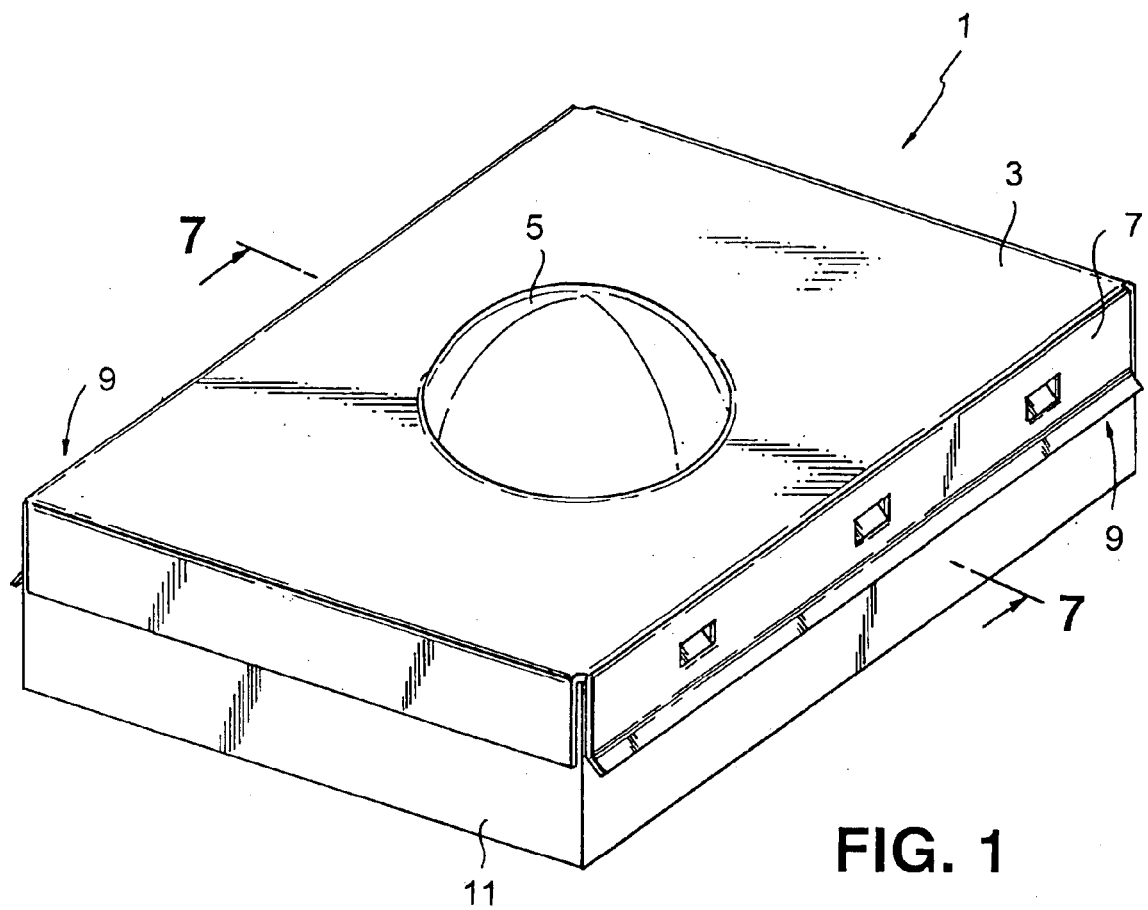
FIG. 1 is a perspective view of an RF shield constructed in accordance with the present invention.
Figure 2:
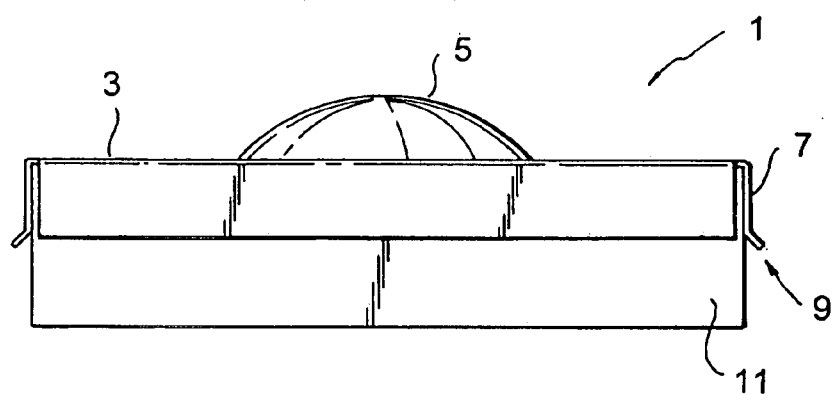
FIG. 2 is a plan side view of the RF shield shown in FIG. 1.
Figure 3:
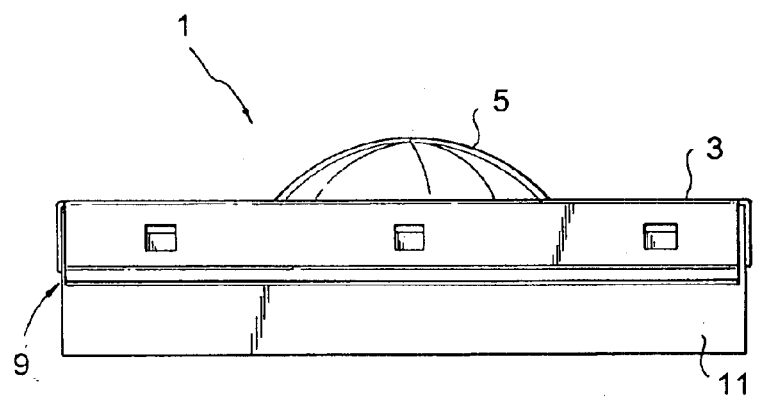
FIG. 3 is a plan side view of the RF shield shown in FIG. 1.

Referring now to the drawings, the present invention is directed to a two-piece RF interference shield illustrated, in perspective view, generally at 1 in FIG. 1. FIG. 1. shows an assembled RF shield 1 wherein the top portion 3 has been fitted to the bottom portion 11. FIGS. 2 and 3 show side views of the assembled RF shield 1. The RF shield 1 is manufactured according to conventional practices by stamping the RF shield 1 from a piece of metal using a die. After the assembly of electrical components on the PCB using conventional practices, the bottom portion 11 of the RF shield 1 is placed over the electrical components and soldered onto the PCB such that the components are within the cavity of the bottom portion 11.

In the preferred embodiment shown, the RF shield 1 is a two-piece design having both a bottom portion 11 and a top portion 3. The unassembled bottom portion 11 is illustrated, in perspective view, in FIG. 6. The unassembled top portion 3 is illustrated, in perspective view, in FIG. 4. The top portion 3 of the RF shield 1 includes a top face 21 wherein a raised portion 5 is located. Extending downwardly from the top face 21 are sidewalls 7 which are adapted to fit about the opposing sidewalls 15 of the bottom portion 11. The sidewalls 7 of the top face 21 are formed so that there are angled extensions 9 at their bottom edges.

Figure 5:
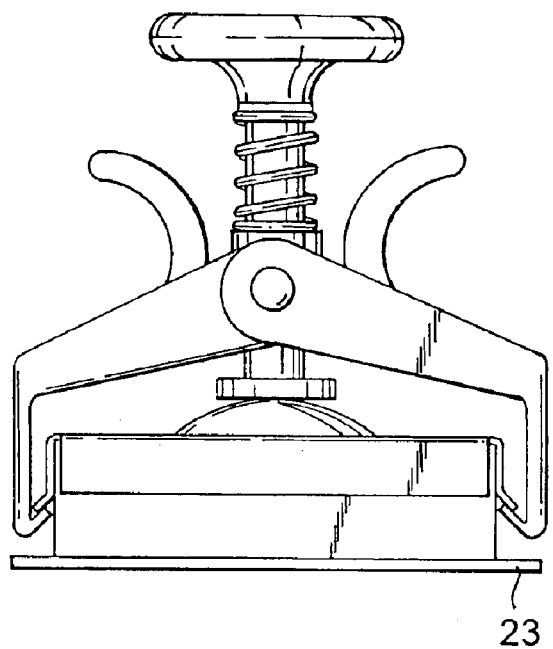
FIG. 5 illustrates an extraction tool used to remove the top portion component of the RF shield shown in FIG. 1.
Figure 6:
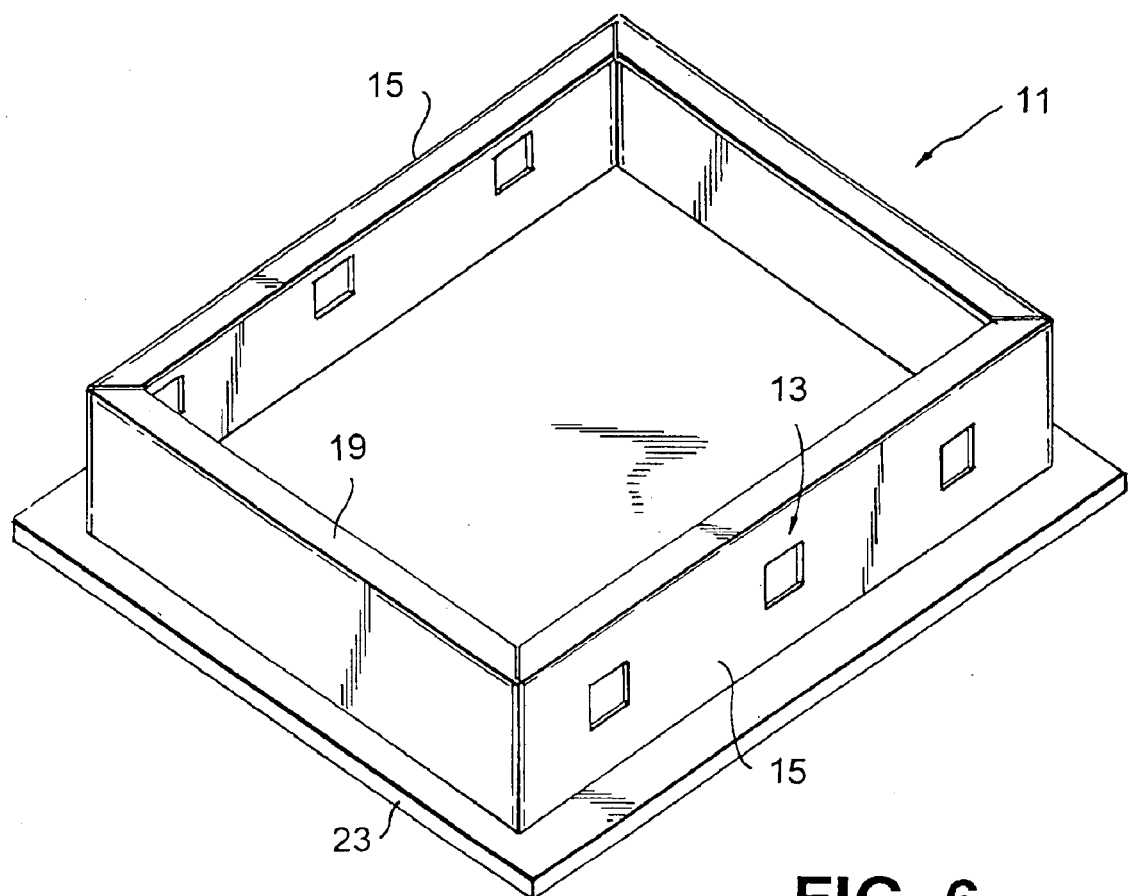
FIG. 6 is a perspective view of the bottom portion component of the RF shield shown in FIG. 1.
Figure 7:
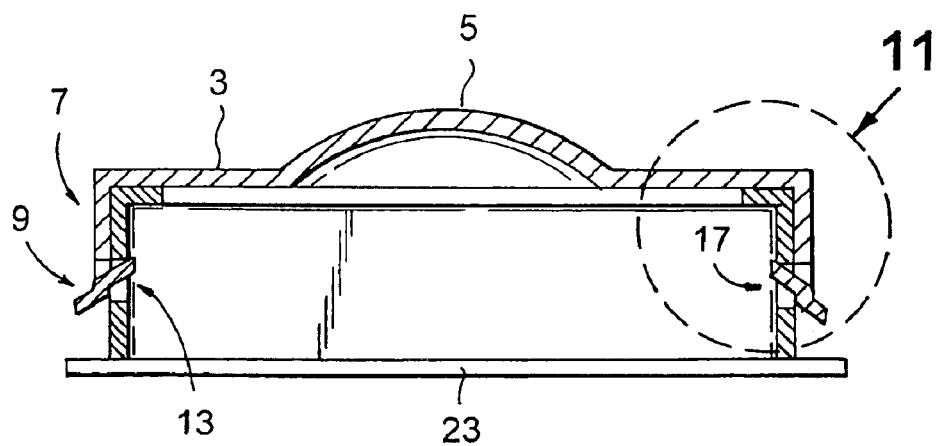
FIG. 7 is a cross-sectional view taken along lines 7—7 of the RF shield shown in FIG. 1.

Referring now to FIGS. 5 and 6, the bottom portion 11 is mounted to a circuit board 23 in order to prevent the electrical components on the circuit board 23 from causing RF interference. The bottom portion 11 includes a plurality of sidewalls that form an enclosure about the electrical components sought to be protected. The bottom portion 11 includes two opposing sidewalls 15 fitted with holes or slots 13 which receive the barbs 17 of the top portion 3. Alternatively, the opposing sidewalls 15 of the bottom portion 11 may be disposed with barbs and the top portion 3 may be disposed with the required holes or slots. The number and location of the holes or slots 13 on the bottom portion 11 correspond to the number and location of the barbs 17 of the top portion sidewalls 7 so that the top portion 3 and the bottom portion 11 can be snapped together. FIG. 7 illustrates a cross-sectional side view of the RF shield 1, taken along line 7—7 of FIG. 1, with the top portion 3 and bottom portion 11 snapped together by way of the barbs 17 on the top portion 3 fitting into the holes or slots 13 of the bottom portion 11. The bottom portion 11 is mounted using solder to the circuit board 23 sought to be shielded. In an alternative embodiment, the bottom portion 11 may be fastened to the circuit board 23 using rivets or clips. FIGS. 1, 2, 3, and 7 show how the top portion sidewalls 7 are parallel to and slightly outward of the opposing sidewalls 15 of the bottom portion 11 and do not extend all the way down to the circuit board 23. This is so that only the bottom portion 11 is fixed to the circuit board 23 and the top portion 3 remains removable. Upon removal of the top portion 3, since the top of the bottom portion 11 is substantially open, the bottom portion 11 can be entered so as to provide access to the electrical components on the circuit board 23.

Figure 4:
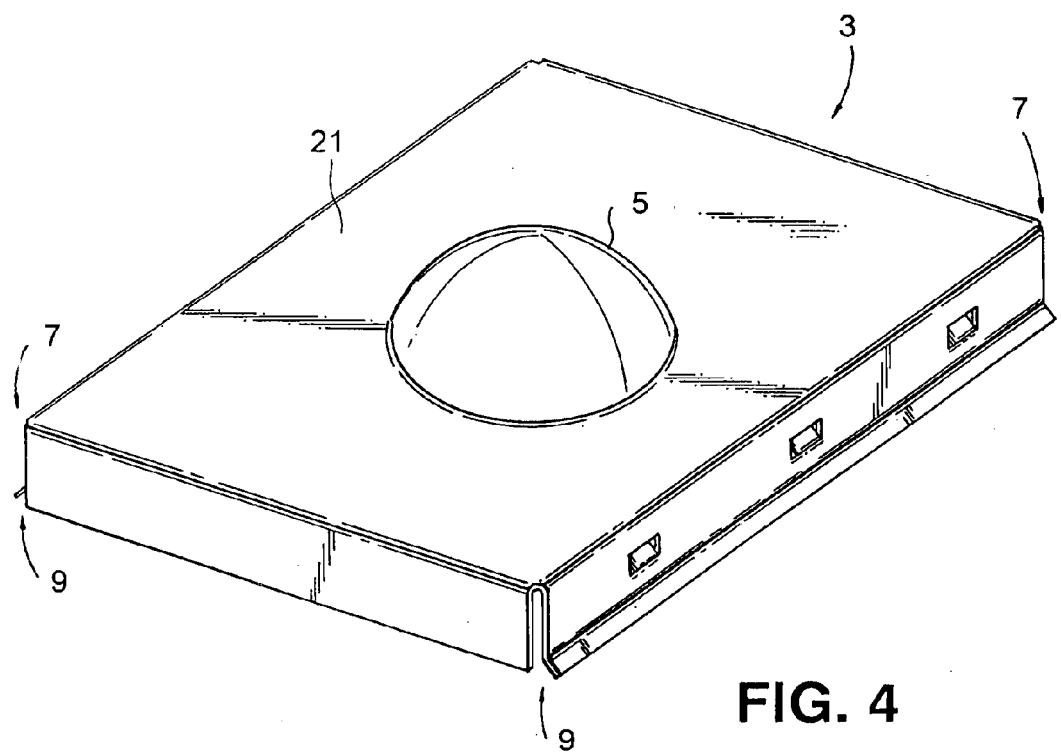
FIG. 4 is a perspective view of the top portion component of the RF shield shown in FIG. 1.

The top portion 3 forms the top side of the two-piece RF shield 1 and completes the protective enclosure. As shown in FIG. 4, the top portion 3 includes a top face 21 having a raised portion 5 and four downwardly extending sidewalls 7, two of which contain no barbs and act to guide the top portion 3 onto the bottom portion 11. Alternatively, the top portion 3 may include two opposing downwardly extending sidewalls which contain the barbs 17. The raised portion 5 is shown being centrally located on the top face 21, however it may be located anywhere along the top face 21. Also, the size and shape of the raised portion 5 may be modified according to the particular application.

Figure 8:
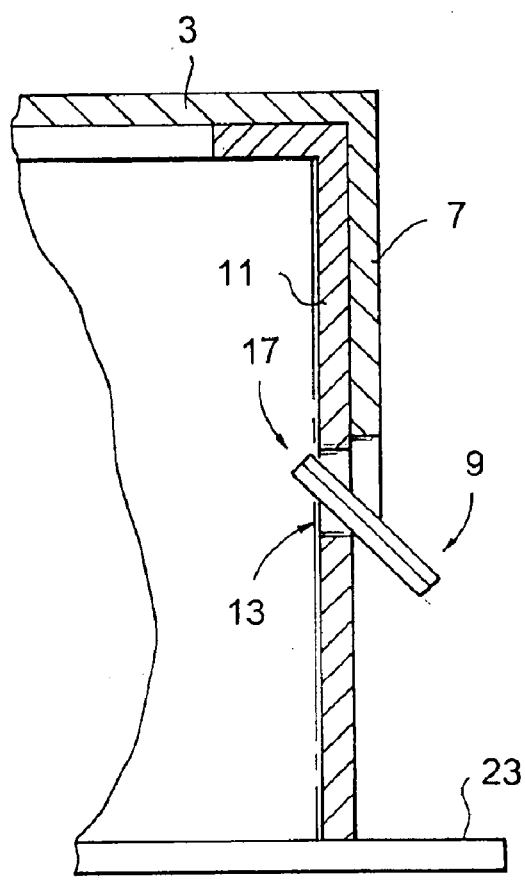
FIG. 8 is an exploded cross-sectional view of FIG. 7.
Figure 9:
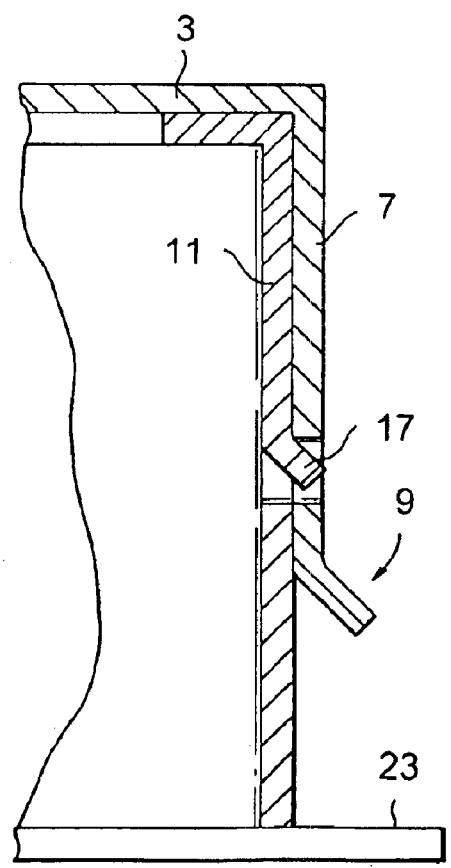
FIG. 9 is an exploded cross-sectional view of an alternative embodiment of an RF shield.

The two downwardly extending sidewalls 7 of the top portion 3 contain the barbs 17 that protrude inwardly toward the bottom portion 11. The barbs 17 fit or snap into the corresponding holes or slots of the bottom portion 11. FIG. 8 is an exploded view of the cross-sectional view of FIG. 7 and shows the barbs 17 of the top portion 3 fitted into place on the bottom portion 11. The barbs 17 may be formed by using a punch press. Illustrated in FIG. 10 is a side view of the top portion having had a punch press make a three-sided square cut 25 into the sidewalls 7, above the angled extensions 9, leaving an uncut portion at the bottom of the square which allows the material to be folded inwardly toward the bottom portion 11, thus creating an inward barb. Alternatively, the barbs 17 can be manufactured as part of the machining process creating the top portion 3. FIG. 11 shows an exploded cross-sectional view of the barbs 17, made using a three-sided cut 25, fitted into the hole or slot 13 of the bottom portion 11. FIG. 9 illustrates another alternative embodiment wherein the barbs 17 are located on the bottom portion and protrude outwards toward the top portion 3 which would in turn house the corresponding holes or slots 13.

Figure 5A:
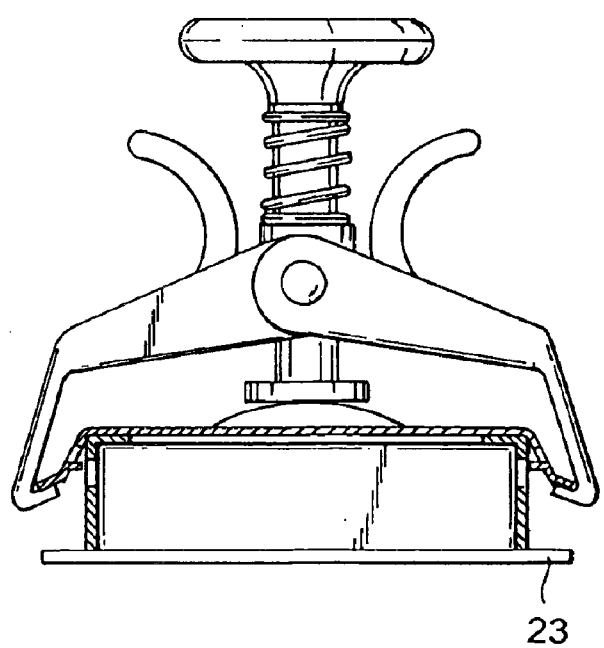
FIG. 5A illustrates an extraction tool used to remove the top portion component of an RF shield not having angled extensions.

Should the electrical components on the printed circuit board require rework or repair during the life of the RF shield 1, the top portion 3 may be removed to allow access to the cavity where the electrical components are located. FIG. 5 illustrates how the raised portion 5 allows an extraction tool to be utilized so that the top portion 3 can be easily disengaged from the bottom portion 11. The sidewalls 7 of the top portion 3 extend downwards, perpendicularly, from the top face 21 and have angled extensions 9 at their bottom edges. As shown in FIG. 5, the angled extensions 9 cooperate with an extraction tool to remove the top portion 3, thereby allowing access to the circuit board 23 underneath. Specifically, the extraction tool pushes down on the raised portion 5 causing the angled extensions 9 to deflect outwardly disengaging the barbs 17 from the slots 13. Simultaneously, the top portion can be removed by lifting the extraction tool who's side arms are beneath the angled extensions 9. FIG. 5A illustrates how an extraction tool cooperates with the raised portion 5 of an RF shield, which does not include the angled extensions 9, to remove the top portion 3 from the bottom portion 11. The extraction tool applies a downward force to the raised portion, thereby causing the downwardly extending sidewalls 7 of the top portion 3 to deflect outwardly from the bottom portion 11 causing the barbs 17 to disengage from the slots 13 and permitting removal of the top portion 3. Similarly, once any rework or repair has been completed, the top portion 3 can be placed back onto the bottom portion 11 by pushing the raised portion 5 of the top portion 3 downward onto the top edge 19 of the bottom portion 3 allowing the barbs 17 on the top portion 3 to fit or snap into the holes 13 of the bottom portion 11. The removing and closing of the top portion 3 of the RF shield 1 may be accomplished many times throughout the life of the RF shield 1 without affecting the structural integrity of the shield.

Figure 12:
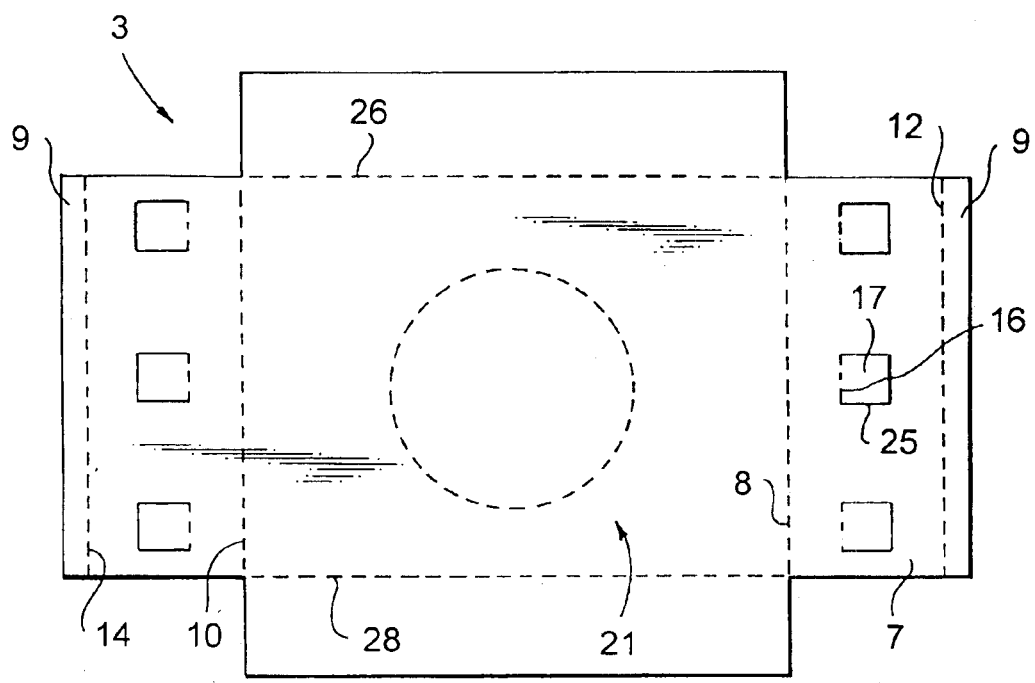
FIG. 12 illustrates the top portion of the RF shield formed by a stamping process.

The RF shield 1 may be manufactured using a stamping process. FIG. 12 is an illustration of the top portion 3 of the RF shield 1 formed by applying a stamping process to a single sheet of metal. The stamping process cuts out the shape shown in FIG. 12, and creates flaps connected to a central surface. The dashed lines 8, 10, 26 and 28 along the flaps of the top portion 3 represent the points at which the flaps are bent so that they downwardly extend from the top face 21 and create the sidewalls 7 of the top portion 3. The outer edges of the sidewalls 7 are deflected along lines 12 and 14 to create the angled extensions 9 of the top portion 3. Also illustrated in FIG. 12 are the barbs 17 formed by using a punch press to make a three-sided square cut 25 into the sidewalls 7, leaving an uncut portion at the bottom of the square 16 where the material is folded inwardly, thus creating an inward barb.

Figure 13:
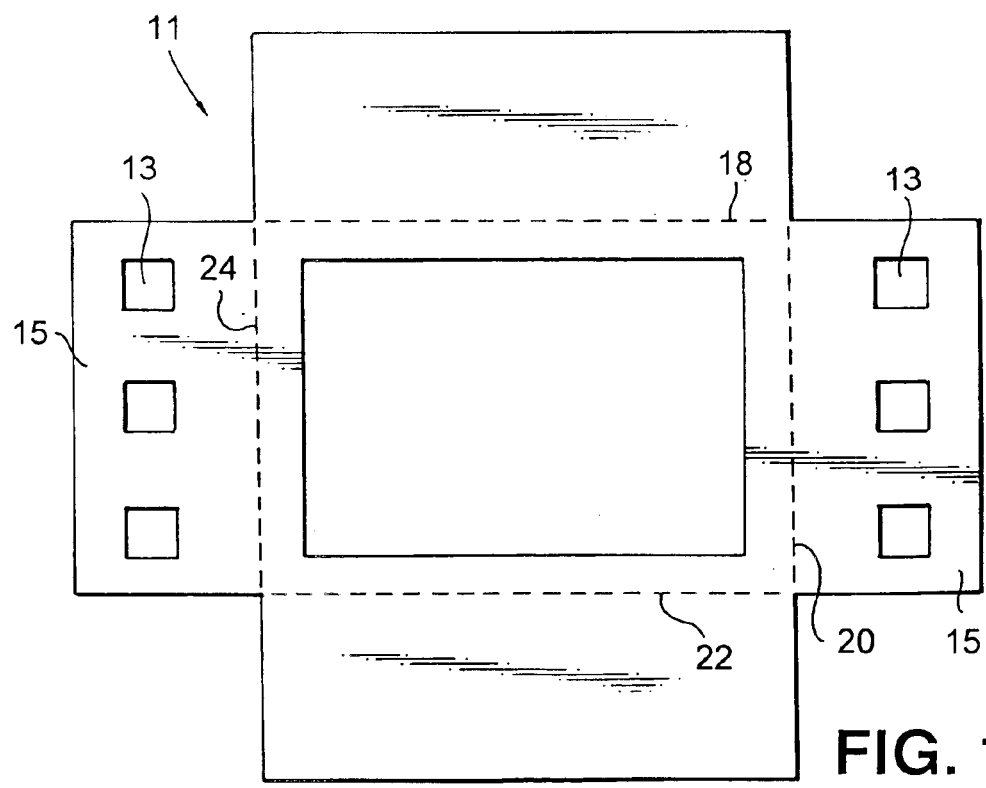
FIG. 13 illustrates the bottom portion of the RF shield formed by a stamping process.

FIG. 13 is an illustration of the bottom portion 3 of the RF shield 1 formed by applying a stamping process to a single sheet of metal. The stamping process cuts out the shape shown in FIG. 13, and creates flaps connected to a central surface. The flaps of the bottom portion 11 are bent upwards along lines 18, 20, 22, and 24 forming an enclosure about the electrical components and creating the sidewalls of the bottom portion 11. Two opposing sidewalls 15 are adapted to contain the holes or slots 13 that will engage the barbs 17 of the top portion 3. After the sidewalls of the bottom portion 11 are bent upwards to form the enclosure, the edges where the sidewalls meet may be spot-soldered to make the bottom portion 11 more rigid.

While the invention has been particularly shown and described with reference to preferred embodiments thereof, it will be understood by those skilled in the art that various changes in form and details may be made therein without departing from the spirit and scope of the invention.

What is claimed is:

1. An electromagnetic shield, comprising:
    a bottom portion and a removably interconnected top portion which are adapted to join together to define an enclosure;
    the bottom portion comprising a plurality of sidewalls and having a substantially open top region and a substantially open bottom region with at least one bottom portion sidewall having one or more apertures;
    the top portion comprising a top surface and a plurality of downwardly extending sidewalls, at least one of said top portion sidewalls having one or more projections adapted to engage said one or more apertures to thereby interconnect said top and bottom portions to define said enclosure; and
    the top surface including a raised portion adapted to cooperate with an extraction tool to disengage the top portion from the bottom portion and thereby allow access to the enclosure through the application of a force to the raised portion that causes at least one of the top portion sidewalls to deflect.

2. The electromagnetic shield according to claim 1, wherein the projections include barbs.

3. The electromagnetic shield according to claim 2, wherein the barbs are deflected inwardly relative to said enclosure.

4. The electromagnetic shield according to claim 2, wherein the barbs are deflected outwardly relative to said enclosure.

5. The electromagnetic shield according to claim 2, wherein the number and location of the barbs on the top portion correspond in number and location to the apertures on the bottom portion.

6. The electromagnetic shield according to claim 2, wherein at least two opposing sidewalls of said top portion are provided with a bottom edge having an angled extension.

7. The electromagnetic shield according to claim 6, wherein the angled extensions cooperate with the extraction tool to disengage the top portion from the bottom portion.

8. The electromagnetic shield according to claim 1, wherein the bottom portion is adapted to be mounted onto a substrate.

9. The electromagnetic shield according to claim 8, wherein said downwardly extending sidewalls terminate prior to reaching a bottom edge of the bottom portion sidewalls so that only the bottom portion is affixed to the substrate.

10. The electromagnetic shield according to claim 1, wherein the top portion includes four downwardly extending sidewalls.

11. The electromagnetic shield according to claim 1, wherein the top portion includes two opposing downwardly extending sidewalls.

12. The electromagnetic shield according to claim 1, wherein the plurality of downwardly extending sidewalls are positioned outside the plurality of sidewalls of the bottom portion when the top and bottom portions are interconnected.

13. The electromagnetic shield according to claim 1, wherein the plurality of downwardly extending sidewalls are positioned inside the plurality of sidewalls of the bottom portion when the top and bottom portions are interconnected.

14. The electromagnetic shield according to claim 1, wherein at least two opposing top portion sidewalls are each provided with at least one barb that engages apertures disposed on the corresponding bottom portion sidewalls.

15. An electromagnetic shield, comprising:
   a bottom portion and a removably interconnected top portion which are adapted to join together to define an enclosure;
   the top portion comprising a top surface and a plurality of downwardly extending sidewalls, at least one of said top portion sidewalls having one or more apertures;
   the bottom portion comprising a plurality of sidewalls and having a substantially open top region and a substantially open bottom region with at least one bottom portion sidewall having projections adapted to engage said one or more apertures to thereby interconnect said top and bottom portions to define said enclosure; and
   the top surface including a raised portion adapted to cooperate with an extraction tool to disengage the top portion from the bottom portion, and thereby allow access to the enclosure, through the application of a force to the raised portion that causes at least one of the top portion sidewalls to deflect.

16. A method of making an electromagnetic shield comprising the following steps of:
   (a) stamping a first predetermined shape out of a single sheet of metal to form a central surface having a top face and bottom face and at least one pair of flaps extending on opposite sides of said central surface;
   (b) forming a raised portion on the top face of said central surface;
   (c) cutting a three-sided square cut into each of said flaps to form a barb;
   (d) bending each of said flaps toward each other substantially along a line connecting each of the flaps to the central surface to create a pair of sidewalls extending generally perpendicularly from the central surface;
   (e) bending each of said barbs toward each other substantially along a respective line connecting each said barb to a respective sidewall to thereby create a top portion of said shield;
   (f) stamping a second predetermined shape out of a single sheet of metal to form a substantially open central region and a plurality of flaps extending outwardly from said central region;
   (g) cutting at least one aperture into at least one flap; and
   (h) bending each of said flaps toward an opposing flap substantially along a respective line connecting each of the flaps to the central region to create a plurality of sidewalls extending generally perpendicularly from said central region to thereby create a bottom portion of said shield.

17. A method of making an electromagnetic shield according to claim 16, further comprising the steps of:
   (a) bending each of said bottom portion flaps toward the central region substantially along a line near the top edge of said flaps to create a lip along a top periphery of said bottom portion.

* * * * *